(12) United States Patent
Kaneko

(10) Patent No.: US 6,999,493 B2
(45) Date of Patent: Feb. 14, 2006

(54) SURFACE EMISSION LASER AND MANUFACTURING METHOD FOR SURFACE EMISSION LASER, LIGHT RECEPTION ELEMENT AND MANUFACTURING METHOD FOR LIGHT RECEPTION ELEMENT, AND OPTICAL TRANSCEIVER MODULE

(75) Inventor: Takeo Kaneko, Misato-Mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/152,848

(22) Filed: May 23, 2002

(65) Prior Publication Data

US 2002/0176468 A1 Nov. 28, 2002

(30) Foreign Application Priority Data

May 25, 2001 (JP) ..................... 2001-157737

(51) Int. Cl.
*H01S 3/08* (2006.01)

(52) U.S. Cl. ..................... 372/101; 372/103
(58) Field of Classification Search ............. 372/101, 372/103
See application file for complete search history.

(56) References Cited

U.S. PATENT DOCUMENTS

| 5,073,041 | A | * | 12/1991 | Rastani | 372/101 |
| 5,633,527 | A | * | 5/1997 | Lear | 257/432 |
| 5,898,191 | A | * | 4/1999 | Kwon et al. | 257/95 |
| 5,966,399 | A | * | 10/1999 | Jiang et al. | 372/96 |
| 5,978,139 | A | * | 11/1999 | Hatakoshi et al. | 359/565 |
| 6,079,860 | A | * | 6/2000 | Ito | 362/509 |
| 6,759,803 | B2 | | 7/2004 | Sorg | 313/512 |

FOREIGN PATENT DOCUMENTS

| JP | A-4-147691 | 5/1992 |
| JP | A-2-231786 | 9/1992 |
| JP | A-9-199795 | 7/1997 |
| JP | A-10-335737 | 12/1998 |
| WO | WO 00/65664 A1 | 11/2000 |

OTHER PUBLICATIONS

A.V. Krishnamoorthy et al., "Vertical–Cavity Surface–Emitting Lasers Flip–Chip Bonded to Gigabit–per–Second CMOS Circuits", *IEEE Photonics Technology Letters*, vol. 11, No. 1, Jan. 1999, pp. 128–130.

*Primary Examiner*—Don Wong
*Assistant Examiner*—James Menefee
(74) *Attorney, Agent, or Firm*—Oliff & Berridge, PLC

(57) ABSTRACT

The invention provides a surface emission laser which can be operated with low-current drive, and a manufacturing method therefor. The invention also provides a light reception element which provides high-speed modulation, and a manufacturing method therefor. The invention also provides an optical transceiver module which provides enhanced optical connection efficiency. An opening portion from the other surface side of the semiconductor substrate to the end portion on the semiconductor substrate side of the light emission portion is formed on the semiconductor substrate of the surface emission laser, and a lens made of a transparent resin is formed through the use of the side surface of the opening portion. An opening portion from the other surface side of the semiconductor substrate to the end portion on the semiconductor substrate side of the light reception portion is formed on the semiconductor substrate of the photodiode, and a lens 6 made of a transparent resin is formed through the use of the side surface of the opening portion. The lens formed on the light emission portion of the aforementioned surface emission laser and the lens formed on the light reception portion of the photodiode are placed facing each other without an optical waveguide therebetween.

8 Claims, 11 Drawing Sheets

OTHER PUBLICATIONS

Uchiyama S. et al., "Two–Dimensional Array of GAINASP/IP Surface–Emitting Lasers" Electronics Letters, IEEE Stevenage, GB, vol. 21, No. 4, Feb. 14, 1985, pp. 162–164.

Blum et al., "Vertical–Cavity Surface–Emitting Lasers with Integrated Refractive Microlenses", Electronics Letters, IEEE Stevenage, GB, vol. 31, No. 1, Jan. 5, 1995, pp. 44–45.

Strzelecka E. M. et al., "Monolithic Integration of Refractive Lenses With Vertical Cavity Lasers and Detectors for Optical Interconnections", Proceedings of the SPIE, vol. 2691, Feb. 1, 1996, pp. 43–53.

* cited by examiner

SURFACE EMISSION LASER AND MANUFACTURING METHOD FOR SURFACE EMISSION LASER, LIGHT RECEPTION ELEMENT AND MANUFACTURING METHOD FOR LIGHT RECEPTION ELEMENT, AND OPTICAL TRANSCEIVER MODULE

BACKGROUND OF THE INVENTION

1. Field of Invention

The present invention relates to a light emission element and a light reception element for optical data communication, and to an optical transceiver module using the light emission element and the light reception element.

2. Description of Related Art

In order to make high-speed modulation possible for a surface emission laser used for optical communication, sometimes, a method of mounting by flip chip bonding without utilizing a wire is adopted. According to this method, since an upper surface side of a semiconductor laminate of a surface emission laser is mounted by a solder bump, etc., laser light is emitted from a lower surface side of the semiconductor substrate.

However, since the wavelength emitted from a common surface emission laser is 850 nm, this method is subject to a disadvantage in that, when a gallium arsenide substrate is used, it is impossible to transmit the laser light.

Herein, in order to address or overcome the aforementioned problem, a method of making the wavelength of a surface emission laser to be 970 nm has been suggested in "IEEE PHOTONICS TECHNOLOGY LETTERS, VOL. 11, NO. 1, JANUARY 1999, p128–130". According to this suggestion; it has become possible to transmit the laser light even when the gallium arsenide substrate has been used.

However, when the wavelength has been 970 nm in accordance with the aforementioned suggestion, since the sensitivity of a PIN photodiode of silicon, which is used for the light reception side, has been reduced, it has been necessary to use a PIN photodiode of expensive InGaAs.

Regarding the surface emission laser which is a light emission element, it is necessary to make the light emission region, to which a current is applied, narrow in order to address or resolve a problem of heat generation, especially in the case where arraying is performed. Accompanying this, the method is subject to a disadvantage in that the radiation angle has been increased and, therefore, the connection efficiency has been reduced. Although it has been attempted to form a lens at an upper surface of the light emission portion in order to reduce the radiation angle, it has been difficult to precisely form a lens having a small curvature radius at a short distance from the light emission portion.

Furthermore, regarding the photodiode which is a light reception element, it is necessary to reduce the element capacity in order to realize the high-speed operation thereof. Accompanying this, the method has been subject to a disadvantage in that the connection efficiency with a fiber or a laser has been reduced.

Regarding the optical transceiver module for optically connecting the light emission element that includes the surface emission laser and the light reception element that includes the photodiode, it has been necessary to reduce the radiation angle of the laser light emitted from the surface emission laser and to increase the light reception area of the photodiode as much as possible.

SUMMARY OF THE INVENTION

The present invention addresses the aforementioned circumstances, and provides a surface emission laser that can transmit laser light of 850 nm and that can operate with low-current drive, and a manufacturing method therefor. The invention also provides a light reception element which provides high-speed modulation, and a manufacturing method therefor. The invention also provides an optical transceiver module which provides excellent optical connection efficiency.

In order to address or resolve the aforementioned problems, the invention of a first aspect is a surface emission laser provided with a substrate, a semiconductor laminate which is formed on one surface of the substrate and which includes a light emission portion to emit laser light, and a pair of electrodes to apply a voltage in order to pass a current in the direction of lamination of the light emission portion. The aforementioned substrate includes an opening portion extending from the other surface of the substrate to the end portion on the aforementioned substrate side of the aforementioned light emission portion. The opening portion is provided with a lens formed through the use of the side surface thereof In accordance with the surface emission laser according to the first aspect, since the substrate is made to include the opening portion from the other surface (that is, on the side where the semiconductor laminate has not been formed) of the substrate to the end portion on the substrate side of the light emission portion, even laser light of 850 nm, which has been impossible to pass through the gallium arsenic substrate, can be passed through. Consequently, it becomes possible to use a PIN photo diode of inexpensive silicon as an element on the light reception side.

Since the opening portion formed on the substrate is provided with the lens, the radiation angle of the laser light emitted from the light emission portion can be reduced and, therefore, it becomes possible to enhance optical connection efficiency.

Since the light emission portion can be made to be narrow and small by being provided with a tens, low-current drive can be utilized, and the problem of heat generation, which occurs in the case where arraying is performed, can be reduced or resolved.

Since it becomes possible to form the lens at a position spaced apart from the light emission portion through the use of the side surface of the opening portion, a lens having a large curvature radius can be formed with ease. Consequently, since parallel light can be achieved even when precision of the curvature radius is not fine, it becomes possible to enhance optical connection efficiency.

The invention of a second aspect is the surface emission laser according to the first aspect, that is provided such that the opening portion is a space which becomes narrow from the other surface of the substrate toward the end portion on the substrate side of the light emission portion.

In accordance with the surface emission laser according to the second aspect, since the opening portion is made to be a space which becomes narrow from the other surface (that is, on the side where the semiconductor laminate has not been formed) of the substrate toward the end portion on the substrate side of the light emission portion, an inclined surface is formed on the side surface thereof. A lens having a large curvature radius can be formed with ease through the use of this inclined surface.

The invention of a third aspect is the surface emission laser according to the first or second aspects, that is provided such that the lens is made of transparent resin.

In accordance with the surface emission laser according to the third aspect, since the lens formed in the surface emission laser is formed by curing the transparent resin, it becomes possible to even form the lens even on a small opening with ease and reliability. By adjusting the wettability between the surface of the substrate and the side surface of the opening portion, the curvature radius of the lens can be set, and either of a concave lens or a convex lens can be formed. Consequently, a lens matching the predetermined conditions can be formed with ease and reliability.

The invention of a fourth aspect is the surface emission laser according to any one of the first to third aspects, that is provided such that an emission opening to emit laser light is opened in the electrode formed on the surface on the side opposite to the substrate side of the light emission portion, and the laser light emitted from the emission opening is made to enter a photo diode so as to provide monitoring.

In accordance with the surface emission laser according to the fourth aspect, since the emission opening to emit the laser light is opened in the electrode formed on the surface on the side opposite to the substrate side of the light emission portion, and the laser light emitted from the emission opening is made to enter the photo diode to provide monitoring, the output optical power, which varies depending on ambient temperature, etc., can be monitored, and the driving current can be controlled. Since the laser light for optical communication is emitted from the opening portion provided on the substrate side of the light emission portion, and the laser light to provide monitoring is emitted from the emission opening provided on the side opposite to the substrate side of the light emission portion, the surface emission laser can be arrayed at a high density, and miniaturization of the surface emission laser array becomes possible.

The invention in accordance with a fifth aspect is a surface emission laser provided with a substrate, a semiconductor laminate which is formed on one surface of the substrate and which includes a light emission portion to emit laser light, and a pair of electrodes to apply a voltage in order to pass a current in the direction of lamination of the light emission portion. An emission opening to emit the laser light is opened in the electrode formed on the surface on the side opposite to laser light emission side of the aforementioned light emission portion. The laser light emitted from the emission opening is made to enter a photo diode so as to provide monitoring.

In accordance with the surface omission laser according to the fifth aspect, since the emission opening to emit the laser light is opened in the electrode formed on the surface on the side opposite to laser light emission side of the light emission portion, and the laser light emitted from the emission opening is made to enter the photo diode for monitoring, in a manner similar to that of the fourth aspect, the output optical power, which varies depending on ambient temperature, etc., can be monitored, and the driving current can be controlled. Since the laser light for optical communication is emitted from the opening portion provided on the substrate side of the light emission portion, and the laser light to provide monitoring is emitted from the emission opening provided on the side opposite to the substrate side of the light emission portion, the surface emission laser can be arrayed at a high density, and miniaturization of the surface emission laser array becomes possible.

The invention in accordance with a sixth aspect is a manufacturing method for a surface emission laser including the steps of: forming a convex light emission portion to emit laser light by etching a semiconductor laminate, which is laminated on one surface of a semiconductor substrate, in a vertical direction, forming an opening portion from the other surface of the semiconductor substrate to the end portion on the semiconductor substrate side of the light emission portion in order to become narrow from the other surface of the semiconductor substrate toward the end portion on the semiconductor substrate side of the light emission portion, injecting a transparent resin into the opening portion, and forming a lens by curing the resin.

In accordance with the manufacturing method for the surface emission laser according to the sixth aspect, the surface emission laser according to any one of the first to fourth aspects can be manufactured with case.

The invention in accordance with a seventh aspect is the manufacturing method for the surface emission laser according to the sixth aspect, that is provided such that, in the step of injecting the resin, the resin is injected after the wettability difference between the side surface of the opening portion and the other surface of the semiconductor substrate is adjusted.

In accordance with the manufacturing method for the surface emission laser according to the seventh aspect, since in the step of injecting the resin, the wettability difference between the side surface of the opening portion and the other surface (that is, on the side where the semiconductor laminate has not been formed) of the semiconductor substrate is adjusted, it becomes possible to form a lens having a predetermined shape on the opening portion with ease.

The invention in accordance with an eighth aspect is a light reception element provided with a substrate, and a light reception portion which is formed on one surface of the substrate and into which laser light enters. The substrate includes an opening portion from the other surface of the substrate to the end portion on the substrate side of the light reception portion, and the opening portion is provided with a lens formed through the use of the side surface thereof.

In accordance with the light reception element according to the eighth aspect, since the opening portion from the other surface (that is, on the side where the light reception portion has not been formed) of the substrate to the end portion on the substrate side of the light reception portion is formed on the substrate, and the opening portion is provided with the lens, an equivalent light reception area of the light reception portion can be enlarged and, therefore, it becomes possible to make the light reception portion of the light reception element to be small. Consequently, high-speed operation can be provided while the optical connection efficiency of the light reception element is maintained to be excellent.

Since it becomes possible to form the lens at a position that is spaced apart from the light reception portion through the use of the side surface of the opening portion, a lens having a large curvature radius can be formed with ease. Consequently, since parallel light can be achieved, even when precision of the curvature radius is not fine, it becomes possible to enhance optical connection efficiency.

The invention in accordance with a ninth aspect is the light reception element according to the eight aspect, that is provided such that the lens is made of transparent resin.

In accordance with the light reception element according to the ninth aspect, since the lens formed in the light reception element is made of transparent resin, effects similar to those of the third aspect can be achieved.

The invention in accordance with a tenth aspect is a manufacturing method for a light reception element including the steps of: forming a convex light reception portion, into which laser light enters, by etching a semiconductor layer, which is formed on one surface of a semiconductor substrate, in a vertical direction, forming an opening portion from the other surface of the semiconductor substrate to the end portion on the semiconductor substrate side of the light reception portion in order to become narrow from the other surface of the semiconductor substrate toward the end portion on the semiconductor substrate side of the light reception portion, injecting a transparent resin into the opening portion, and forming a lens by curing the resin.

In accordance with the manufacturing method for the light reception element according to the tenth aspect, the light reception element according to the eighth or ninth aspects can be manufactured with ease.

The invention in accordance with an eleventh aspect is an optical transceiver module including the surface emission laser according to any one of the first to fourth aspects.

In accordance with the optical transceiver module according to the eleventh aspect, by including the surface emission laser according to any one of the first to fourth aspects, it is possible to provide an optical transceiver module which can be operated with a low current drive, and in which the optical connection efficiency is excellent.

The invention in accordance with a twelfth aspect is an optical transceiver module including the light reception element according to the eighth or ninth aspects.

In accordance with the optical transceiver module according to the twelfth aspect, by including the light reception element according to the eight or ninth aspects, it is possible to provide the optical transceiver module which provides high-speed modulation, and excellent optical connection efficiency.

The invention in accordance with a thirteenth aspect is an optical transceiver module including the surface emission laser according to any one of the first to fourth aspects, and the light reception element according to the eighth or ninth aspects.

In accordance with the optical transceiver module according to the thirteenth aspect, by including the surface emission laser according to any one of the first to fourth aspects and the light reception element according to the eighth or ninth aspects, it is possible to provide an optical transceiver module which can be operated with low-current drive, and which provides high-speed modulation and excellent optical connection efficiency. Furthermore, since lenses are formed in both the light emission element and the light reception element, optical data communication between IC chips, in which direct optical connection is performed without utilizing an optical waveguide, is made possible.

DETAILED DESCRIPTION OF PREFERRED EMBODIMENTS

Embodiments according to the present invention will be described below with reference to drawings.

Figure 1:
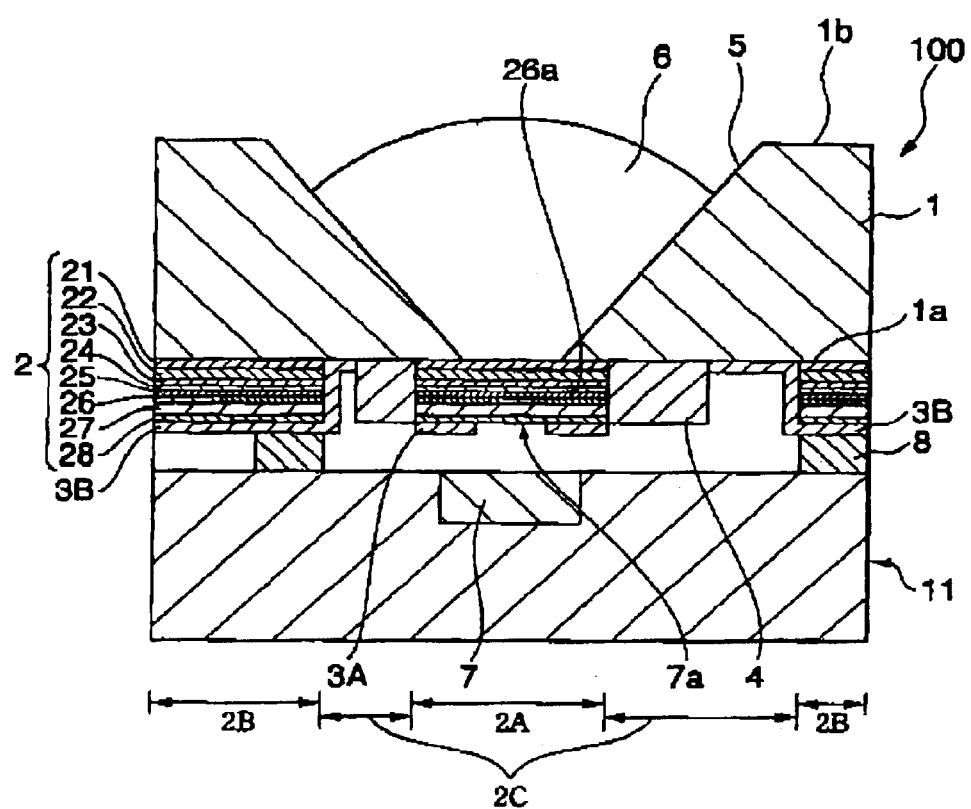
FIG. 1 is a sectional view of a surface emission laser of an embodiment according to the present invention.

FIG. 1 is a sectional view of a surface emission laser of an embodiment according to the present invention.

A surface emission laser 100 is a vertical resonator type surface emission laser (VCSEL), as shown in FIG. 1, and is formed of a semiconductor substrate 1 made of n-type GaAs having a thickness of 250 $\mu$m, a semiconductor laminate 2 which is formed on one surface (the lower surface in FIG. 1) 1$a$ side, and in which a light emission portion 2A and a reinforcement portion 2B are divided with concave portion 2C therebetween, and one pair of electrodes 3 to apply a voltage in order to pass a current in the direction of lamination of the light emission portion 2A, and is mounted on a drive substrate 11 with the semicunductor laminate 2 of this surface emission laser 100 facing down.

This semiconductor laminate 2 is formed of an etching stop layer 21, an n-type DBR layer 22, an n-type spacer layer 23, an MQW active layer 24, a p-type spacer layer 25, a current constriction layer 26, a p-type DBR layer 27, and a p-type contact layer 28, which are laminated in that order from one surface 1$a$ side of the substrate 1.

The etching stop layer 21 has a thickness of 100 nm, and is formed of an n-type $Al_{0.8}Ga_{0.2}As$ layer. The n-type DBR layer 22 is a multi-ply layer formed of twenty-eight pairs of n-type $Al_{0.15}Ga_{0.85}As$ layer and n-type $Al_{0.86}Ga_{O.14}As$ layer. The n-type spacer layer 23 is formed of an n-type $Al_{0.15}Ga_{0.85}As$ layer. The MQW active layer 24 is formed of three layers of quantum well layers made of GaAs. The p-type spacer layer 25 is formed of a p-type $Al_{0.15}Ga_{0.85}As$ layer.

The current constriction layer 26 is made of p-type AlAs. This current constriction layer 26 is within the range of a circle having a predetermined diameter, and an insulation material layer 26$a$ made of aluminum oxide is formed on the periphery thereof by a few micrometers. This current constriction layer 26 is formed in order to concentrate the current from a p-type metal electrode 3A on the center portion of the light emission portion 2A.

The p-type DBR layer 27 is a multi-ply layer formed of thirty-six pairs of n-type $Al_{0.15}Ga_{0.85}As$ layer and p-type $Al_{0.86}Ga_{0.14}As$ layer. The p-type contact layer 28 is formed of a p-type $Al_{0.15}Ga_{0.85}As$ layer.

The layers of this semiconductor laminate 2 are sequentially laminated on one surface 1$a$ side of the semiconductor substrate 1 and, thereafter, a ring-shaped concave portion 2C is formed by etching in a vertical direction in order to expose the surface of the semiconductor substrate 1. Consequently, the cylindrical column-shaped light emission portion 2A and the reinforcement portion 2B on the periphery thereof are divided with the concave portion 2C therebetween. In this concave portion 2C, an insulating material 4, for example, polyimide, is embedded on the periphery of the light emission portion 2A.

The p-type metal electrode 3A is formed into the shape of a ring on the surface (the lower surface of the light emission portion 2A in FIG. 1) on the side opposite to the semiconductor substrate 1 side of the light emission portion 2A, and is contacted with the p-type contact layer 28. The ring-shaped center portion is an emission opening 7a from which laser to perform monitoring is emitted. The material to form the p-type metal electrode 3A is formed of chromium, gold-zinc alloy, and gold.

The n-type metal electrode 3B is formed on the surface (the lower surface of the reinforcement portion 2B in FIG. 1) on the side opposite to the semiconductor substrate 1 side and the side surface of the reinforcement portion 2B in order to cover the reinforcement portion 2B and, furthermore, on a part on one surface 1a side of the semiconductor substrate 1, and is contacted with the p-type contact layer 28. The material to form the n-type metal electrode 3B is formed of gold-germanium alloy, nickel, and gold.

In this semiconductor substrate 1 of the surface emission laser 100, an opening portion 5 from the other surface (the upper surface in FIG. 1) 1b side of the semiconductor substrate 1 to the end portion on the semiconductor substrate 1 side of the light emission portion 2A is formed into the shape of a quadrangular pyramid in which the base is the other surface 1b side of the semiconductor substrate 1. On this opening portion 5, a convex lens 6, which is made of a transparent resin and which has a large curvature radius, is formed toward the other surface 1b side of the semiconductor substrate 1. The convex shape of this lens 6 is formed by curing the part bulged due to the surface tension of the resin during injection of the transparent resin into the opening portion 5 without further treatment. Any resin, for example, thermosetting resins, e.g., fluorinated polyimide and PMMA, and visible light or ultraviolet cure type epoxy resins, may be used as the material to form the resin as long as it is a transparent material having a wavelength of 850 nm.

Solder bumps 8 are formed on the n-type metal electrode 3B of the surface emission laser 100 having the aforementioned configuration, and mounting is performed on the drive substrate 11 including a plurality of transmitting circuits for VCSEL by flip chip bonding. On this drive substrate 11, a photo diode 7 to monitor is formed at the position facing an emission opening 7a of the laser light to monitor opened in the p-type metal electrode 3A of the surface emission laser 100.

In the surface emission laser 100 having the aforementioned configuration, by applying a voltage between the p-type metal electrode 3A and the n-type metal electrode 3B, a current passes in the direction of lamination of the light emission portion 2A, and the laser light is emitted from the lens 6 provided on the opening portion 5 placed on the other surface (the upper surface in FIG. 1) 1b side of the semiconductor substrate 1. At this time, the laser light to monitor emitted from the emission opening 7a formed on the surface (the lower surface in FIG. 1) on the side opposite to the semiconductor substrate 1 side of the light emission portion 2A is absorbed by the photodiode 7 to monitor formed on the drive substrate 11 on the side opposite to the semiconductor substrate 1 side and, therefore, the output optical power can be monitored.

Next, a manufacturing method for the surface emission laser 100 according to the embodiment of the present invention will be described with reference to FIG. 3 to FIG. 8. FIG. 3 to FIG. 8 are sectional views, each showing one manufacturing step for the surface emission laser according to the present invention.

Figure 3:
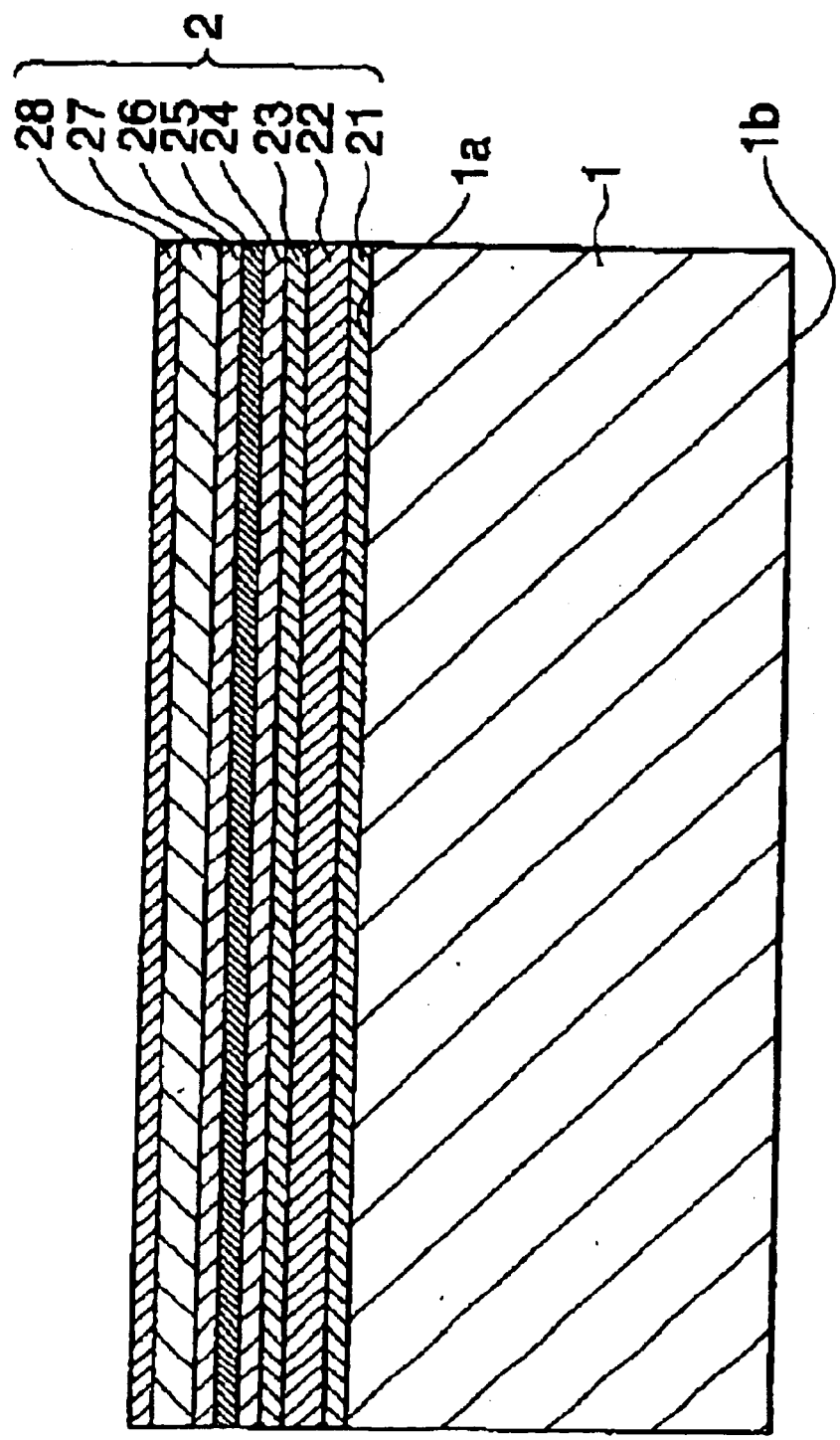
FIG. 3 is a sectional view showing a manufacturing step for a surface emission laser according to the present invention.

As shown in FIG. 3, the etching stop layer 21, the n-type DBR layer 22, the n-type spacer layer 23, the MQW active layer 24, the p-type spacer layer 25, the current constriction layer 26, the p-type DBR layer 27, and the p-type contact layer 28 are laminated sequentially on one surface (the upper surface in FIG. 3) 1a of the high-resistance semiconductor substrate 1 made of GaAs.

Each semiconductor laminate 2 is epitaxially grown by an organic metal CVD (MOCVD/Metal Organic Chemical Vapor Deposition) method. The invention is not limited to the MOCVD method, and MBE (Molecular Beam Epitaxy) method may also be used, for example.

Figure 4:
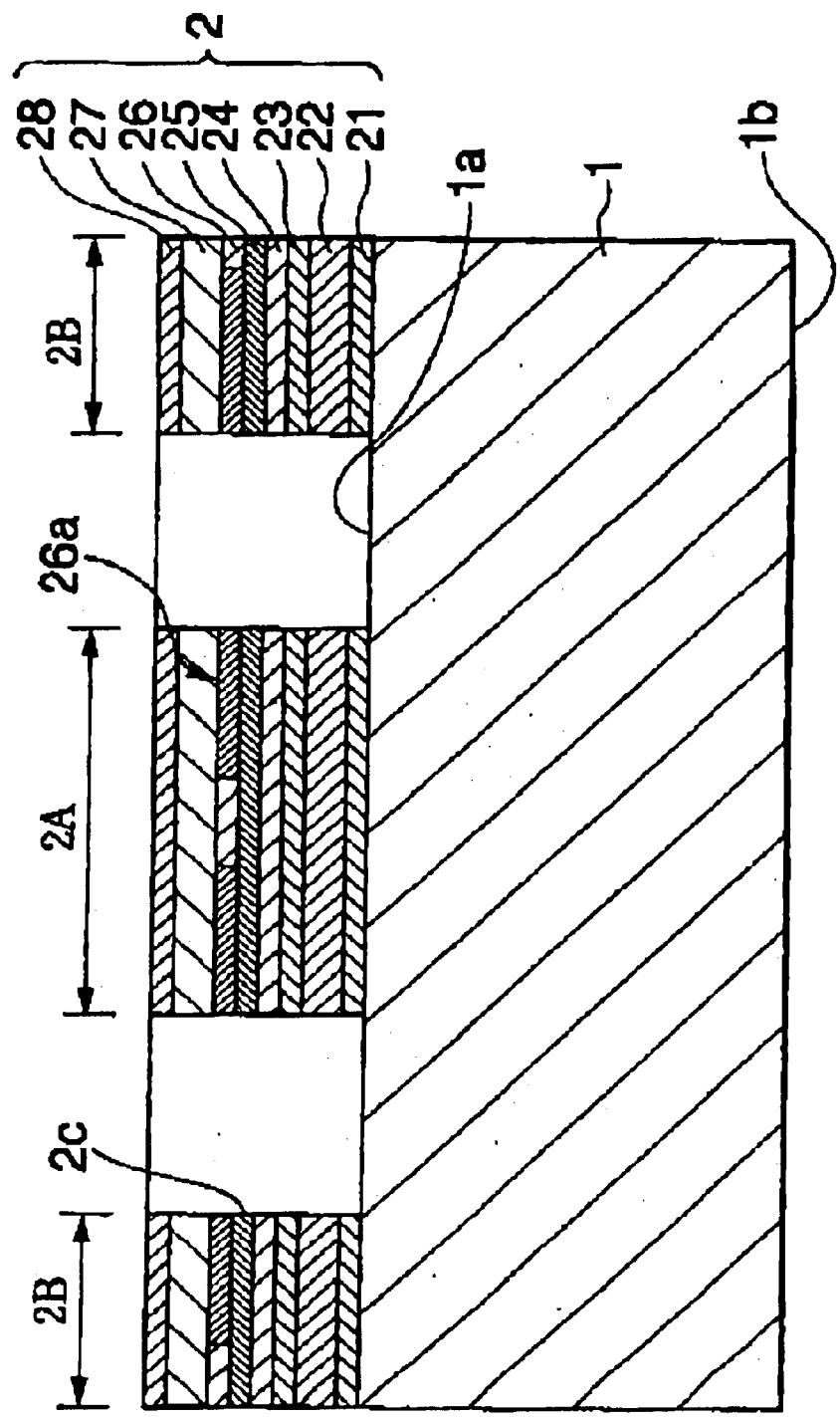
FIG. 4 is a sectional view showing a manufacturing step for the surface emission laser according to the present invention.

After a coating of photoresist is applied on the p-type contact layer 28, the photoresist is patterned by photolithography and, therefore, a resist layer having a predetermined pattern is formed in order to only apply etching to the periphery of the light emission portion 2A. As shown in FIG. 4, dry etching is performed using this resist layer as a mask until the semiconductor substrate 1 is exposed and, therefore, the ring-shaped concave portion 2C is formed. Herein, the cylindrical column-shaped light emission portion 2A and the reinforcement portion 2B on the periphery thereof are formed in the semiconductor laminate 2 with the concave portion 2C therebetween.

The current constriction layer 26 made of p-type AlAs is exposed under a nitrogen atmosphere containing steam at about 400° C. Consequently, the AlAs layer is oxidized from the exposed surface thereof toward the inside and, therefore, an insulation material layer 26a made of aluminum oxide is formed wound the semiconductor layer made of AlAs. Herein, the insulation material layer 26a is formed into a ring shape on the outer perimeter of the current constriction layer 26 on the order of 2 μm in radius remaining at the center of the light emission portion 2A.

Figure 5:
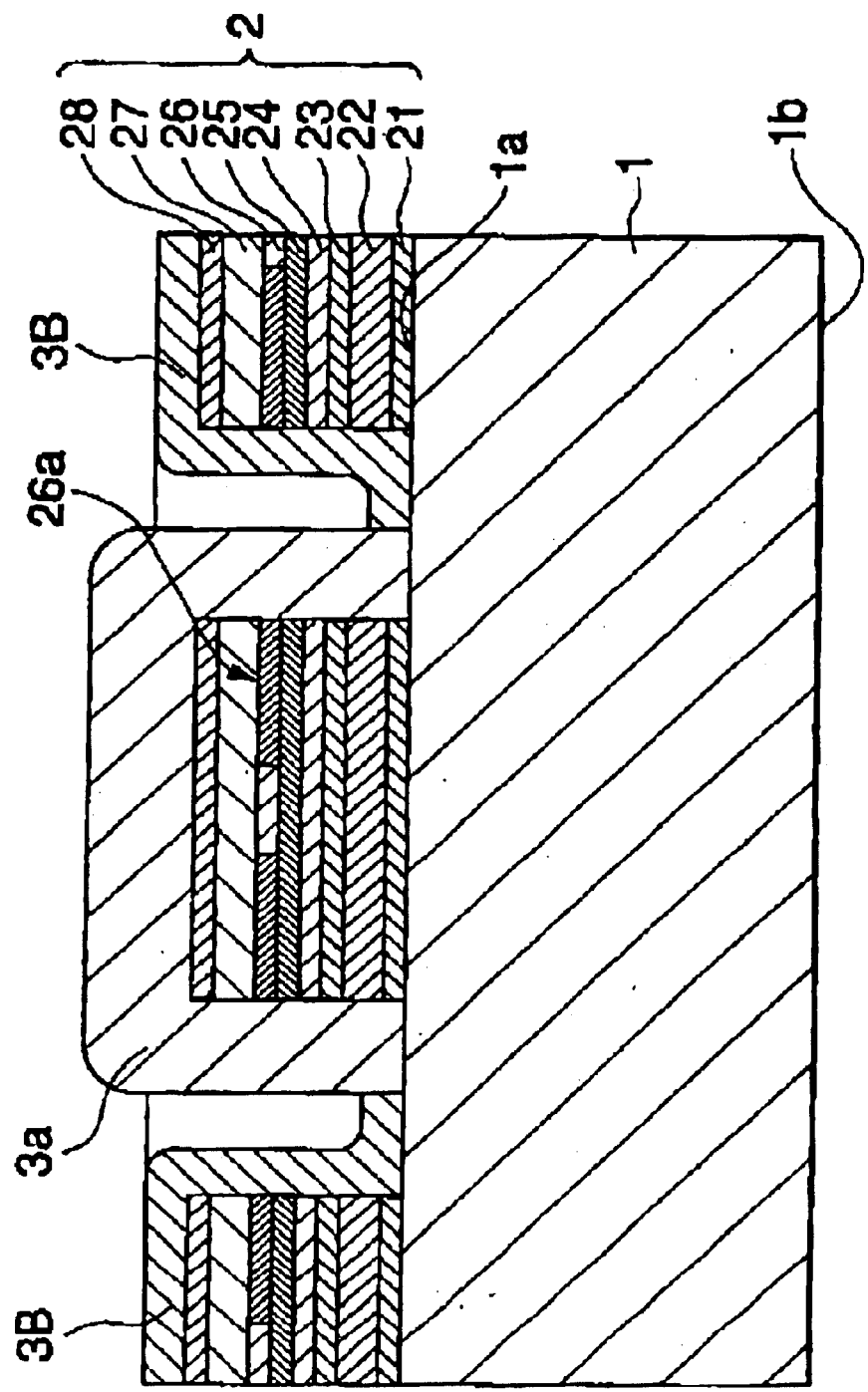
FIG. 5 is a sectional view showing a manufacturing step for the surface emission laser according to the present invention.

As shown in FIG. 5, a resist 3a is formed on the upper surface and side surface of the semiconductor laminate 2 to become the light emission portion 2A and, thereafter, 150 nm of gold-germanium alloy, 100 nm of nickel, and 100 nm of gold are evaporated in that order. Herein, the n-type metal electrode 3B is formed on the upper surface and side surface of the semiconductor laminate 2 to become the reinforcement portion 2B, and a part of one surface (the upper surface in FIG. 5) 1a of the semiconductor substrate 1.

Figure 6:
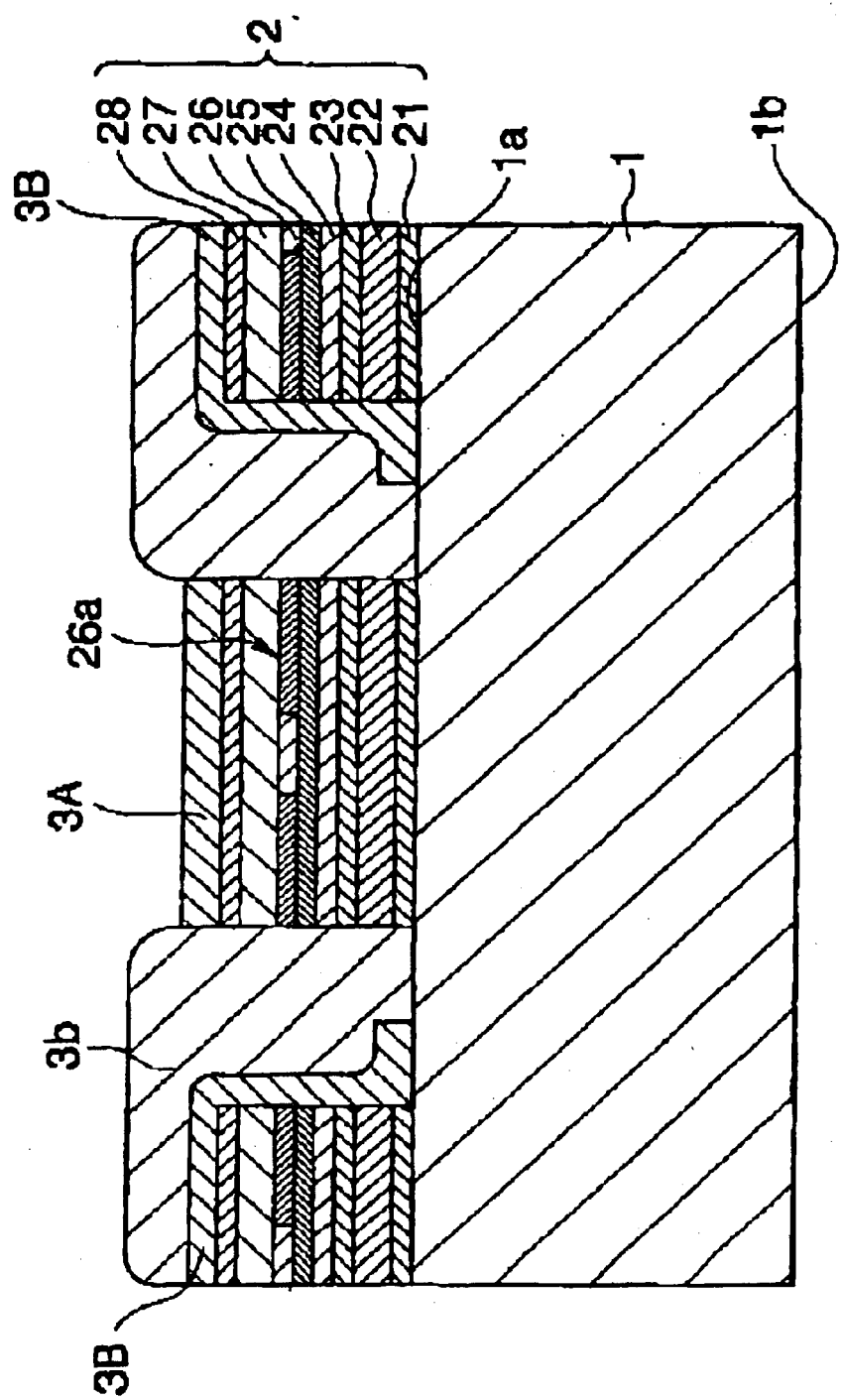
FIG. 6 is a sectional view showing a manufacturing step for the surface emission laser according to the present invention.

The resist 3a in the preceding step is peeled off with acetone and, thereafter, as shown in FIG. 6, a resist 3b is formed in a manner similar to that in the n-type metal electrode 3B except that the upper surface of the semiconductor laminate 2 becomes the light emission portion 2A. Subsequently, 100 nm of chromium, 100 nm of gold-zinc alloy, and 10 nm of gold are evaporated in that order. The resist 3b is peeled off in a manner similar to that in the n-type metal electrode 3B and, therefore, the p-type metal electrode 3A is formed.

Figure 7:
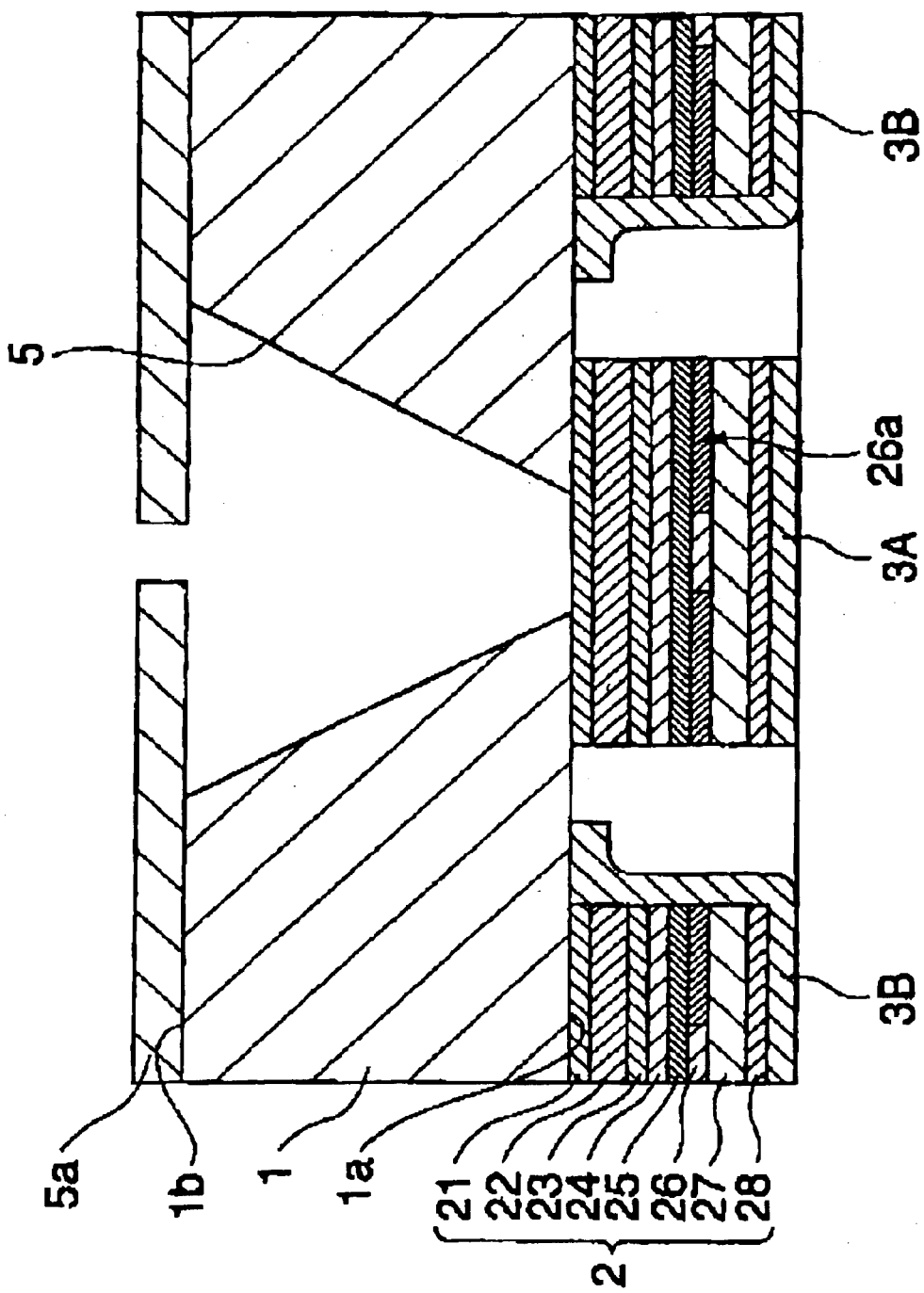
FIG. 7 is a sectional view showing a manufacturing step for the surface emission laser according to the present invention.

As shown in FIG. 7, the surface emission laser formed through the aforementioned steps is reset in order that the semiconductor substrate 1 is positioned on the upper side and, thereafter, 150 nm of silicon oxide film 5a is formed on the other surface (the upper surface in FIG. 7) 1b side of the semiconductor substrate 1. A resist is formed on the silicon oxide film 5a, and a circularly opened resist pattern is formed in accordance with the center of the light emission portion 2A with a double-sided aligner. Through the use of this resist pattern, a circular opening is formed in the silicon oxide film 5a by reactive ion etching (RIE/Reactive Ion Etching) with carbon tetrafluoride, etc. Subsequently, wet etching is performed using the silicon oxide film 5a as a mask in a solution at 60° C. at a velocity of about 10 µm/min. Herein, the quadrangular pyramid-shaped opening portion 5, in which the base is the other surface 1b of the semiconductor substrate 1, is formed due to the crystal structure of the semiconductor substrate 1 made of n-type GaAs. The opening diameter of the opening portion 5 on the etching stop layer 21 is made to be larger than the diameter of the current constriction layer 26 by more than 2 µm, and is made to be smaller than the diameter of the light emission portion 2A. This is for the purpose of suppressing absorption at the semiconductor substrate 1 by spreading of the laser light in the surface emission laser 100. Herein, in the present embodiment, since the diameter of the current constriction layer 26 is 4 µm, the opening diameter of the etching stop layer 21 is desirably 6 µm. Furthermore, in this wet etching, since when an isotropic etchant, for example, $3H_2SO_4+H_2O_2+H_2O$ and $5 H_3PO_4$, is used, the opening is formed into a circular shape, it is effective to form the isotropic lens 6.

Figure 8:
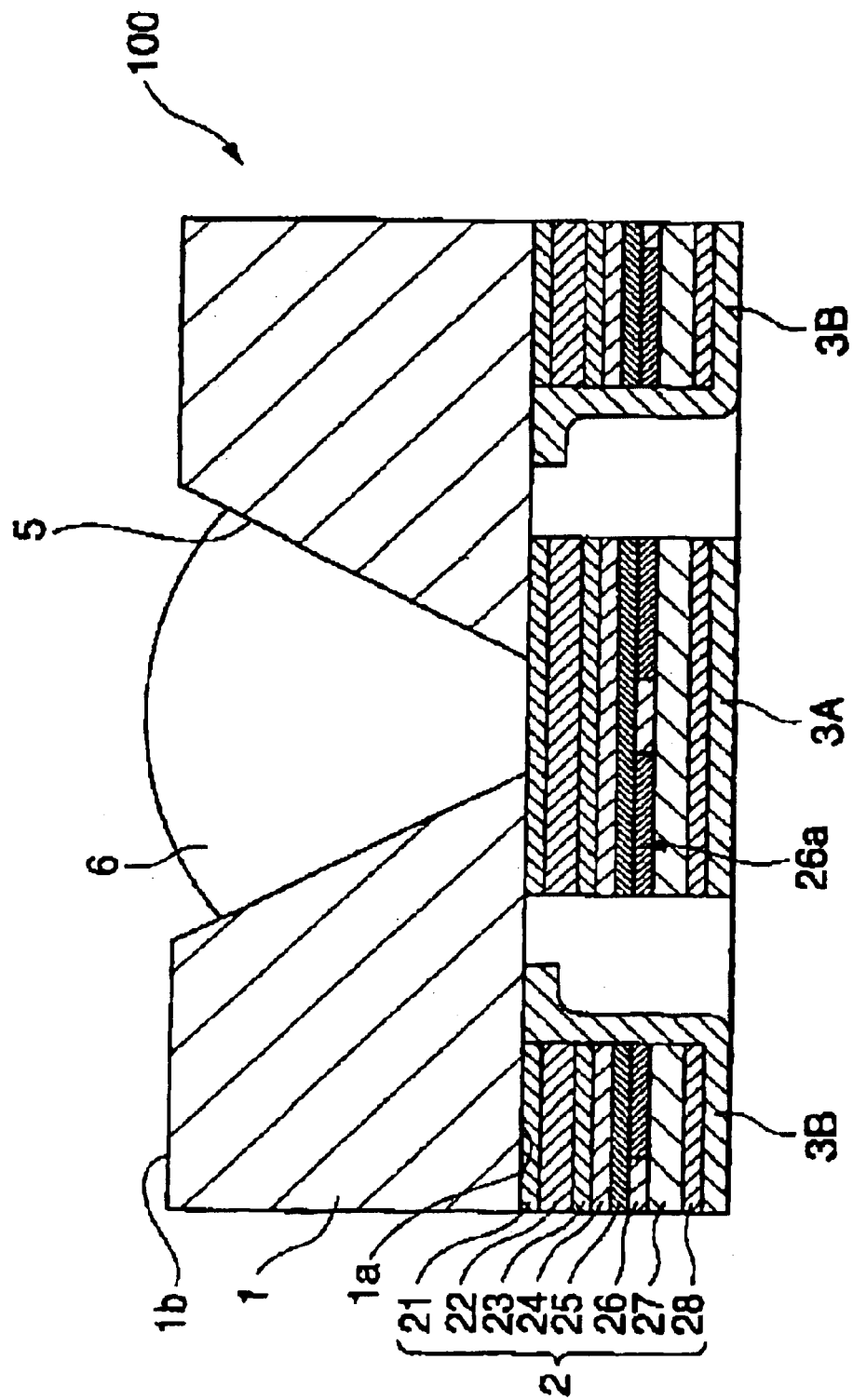
FIG. 8 is a sectional view showing a manufacturing step for the surface emission laser according to the present invention.

After the silicon oxide film 5a is removed in hydrogen fluoride or by dry etching, as shown in FIG. 8, the water repellency on the other surface (the upper surface in FIG. 8) 1b of the semiconductor substrate 1 is adjusted by a plasma treatment with a carbon tetrafluoride gas. Subsequently, a transparent resin is injected into the opening portion 5 by an ink-jet (IJ) method, etc., while the mounting substrate 11 is in the condition of being held horizontally. Consequently, the surface of the resin injected into the opening portion 5 bulges due to the surface tension. Thereafter, the resin is cured using the resin property of being cured by heat, visible light, or ultraviolet ray while the mounting substrate 11 is held horizontally, and the resin is kept in the aforementioned condition. Herein, the convex lens 6 formed due to the surface tension of the resin is completed.

When the other surface 1b of the semiconductor substrate 1 is made to have water repellency with respect to the resin, the side surface of the opening portion 5 is adjusted to have hydrophilicity with respect to the resin and, thereafter, the transparent resin is injected into the opening portion 5 by the aforementioned IJ method, etc., it is also possible to form a concave lens 6 on the opening portion 5 due to the wettability difference (not shown in FIG. 8).

Herein, as the method for injecting the resin into the opening portion 5, the following method can also be considered.

On the other surface 1b side of the semiconductor substrate 1, on which the opening portion 5 has been formed, a film, for example, resist, polyimide, or SAM (Self-Assembly) film, which is different from the semiconductor substrate 1 made of GaAs, is formed. The film is only removed from the opening portion 5 by pattering, and if necessary, the wettability difference between the side surface of the opening portion 5 and the other surface 1b side of the semiconductor substrate 1 is adjusted by the plasma treatment, etc.

The other surface 1b of the semiconductor substrate 1 is coated with the resin while the film remaining on the other surface 1b side of the semiconductor substrate 1 has water repellency, and the opening portion 5 has hydrophilicity.

Consequently, the resin is only left on the hydrophilic opening portion 5 due to the wettability difference between the film on the other surface 1b side of the semiconductor substrate 1 and the side surface of the opening portion 5 and, therefore, the concave lens 6 is formed.

On the other hand, when the aforementioned SAM film, etc., are formed on the other surface 1b of the semiconductor substrate 1 and the opening portion 5 in order to have water repellency with respect to the resin, the convex lens 6 is formed on the opening portion 5.

As described above, since the curvature radius of the lens 6 is determined depending on the wettability difference between the other surface 1b of the semiconductor substrate 1 and the side surface of the opening portion 5, it is possible to freely change the curvature radius depending on usage. When a resin having a large refractive index is used, it becomes possible to increase the curvature radius of the lens 6 and, therefore, it becomes possible to increase the production margin. In accordance with the semiconductor substrate 1 made of GaAs having a thickness of 250 µm as in the embodiment according to the present invention, it is desirable that the resin refractive index n=1.6 and that the curvature radius R equal approximately 100. The lens 6 in such a condition was formed and the measurement was performed. As a result, although the radiation angle had a fill angle at half maximum of 25° and, therefore, was spread when the lens 6 was not provided, the radiation angle was 6° and, therefore, a narrow beam was achieved when the lens 6 was formed.

In the surface emission laser 100 according to the present invention, since the opening portion 5 from the other surface (the surface on which semiconductor laminate is not formed) side of the semiconductor substrate 1 to the end portion on the semiconductor substrate 1 side of the light emission portion 2A is formed on the semiconductor substrate 1, the laser light can be emitted from the opening portion 5. Consequently, even when a gallium arsenide substrate is used, it becomes possible to emit laser light of 850 nm and, therefore, a PIN photodiode of inexpensive silicon can be used as a light reception element.

Since the lens 6 is formed on the opening portion 5 formed in the semiconductor substrate 1, the radiation angle of the laser light emitted from the light emission portion 2A can be reduced and, therefore, it becomes possible to enhance the optical connection efficiency.

Since the lens 6 is formed, it becomes possible to make the light emission portion 2A to be narrow and small. Consequently, low-current drive is made possible, and the problem of heat generation, which occurs in the case where arraying is performed, can be addressed or resolved.

Since the lens 6 is formed through the use of the side surface of the opening portion 5, the lens 6 can be formed at a position spaced apart from the light emission portion 2A and, therefore, a lens 6 having a large curvature radius can be formed with ease. Consequently, parallel light can be achieved even when precision of the curvature radius is not fine and, therefore, it becomes possible to enhance optical connection efficiency.

Since the lens 6 is formed by curing the transparent resin, it becomes possible to even form the lens 6 on a small opening portion 5 with ease and reliability. By adjusting the wettability between the other surface 1b of the semiconductor substrate 1 and the side surface of the opening portion 5, the curvature radius can be set freely, and either a concave lens or a convex lens can be formed. Consequently, a lens 6 that is best-suited to the predetermined conditions can be formed with ease and reliability.

Since the substrate is specified to be the semiconductor substrate 1, the opening portion 5 is formed due to the crystallinity of the semiconductor substrate 1 and, therefore, the opening portion 5 having a inclined surface can be formed with ease and reliability.

Since the emission opening 7a is formed in the electrode 3 formed on the side opposite to the semiconductor substrate 1 side of the light emission portion 2A of the surface emission laser 100, and the laser light to monitor emitted from this emission opening 7a is made to enter the photodiode 7 to monitor, it becomes possible to array the surface emission laser at a high density, and it is effective to miniaturize the surface emission laser array.

Figure 2:
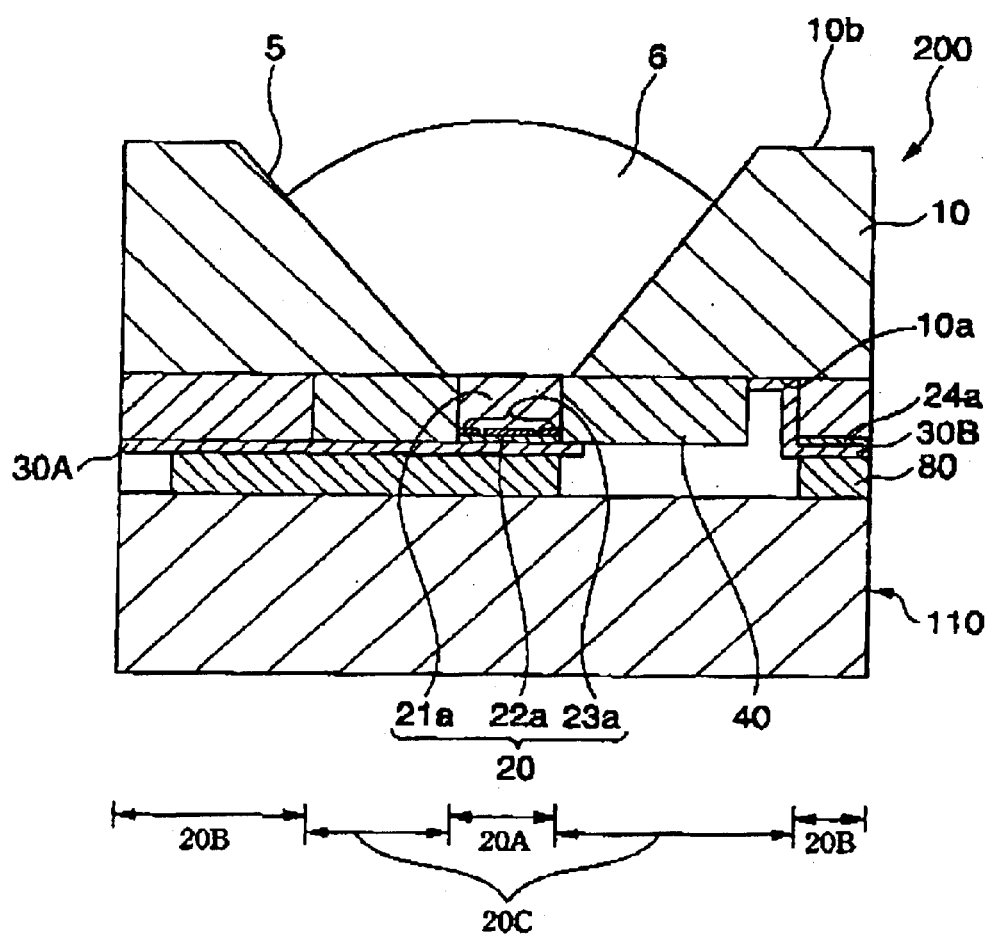
FIG. 2 is a sectional view of a photo diode of an embodiment according to the present invention.

Next, a photodiode 200, which is the light reception element according to the present invention, will be described with reference to the drawings. FIG. 2 is a sectional view of a photodiode showing an embodiment according to the present invention.

The photodiode 200 is a PIN photodiode of silicon, and as shown in FIG. 2, is formed of a semiconductor substrate 10 made of p$^+$-diffusion layer silicon, a semiconductor layer 20 formed on one surface (the lower surface in FIG. 2) 10a side thereof, an insulation layer 24a which is made of a silicon oxide film and which is formed on the surface (the lower surface in FIG. 2) on the side opposite to the semiconductor substrate 10 side of the semiconductor layer 20, and a pair of electrodes 30. This photodiode 200 is mounted on a drive substrate 110 with the semiconductor layer 20 facing down.

In accordance with the semiconductor layer 20, a light absorption layer (i layer) 21 a made of a p$^-$-diffusion layer is formed on one surface (the lower surface in FIG. 2) 10a of the semiconductor substrate (p layer) 10, and an n$^+$-region (n layer) 22a surrounded by a p+-region 23a is formed on the surface (the lower surface in FIG. 2) on the side opposite to the semiconductor substrate 10 side of this i layer 21a and, therefore, a PIN photodiode is formed.

In accordance with the semiconductor substrate 10 on which this semiconductor layer 20 is formed, a ring-shaped concave portion 20C is formed by etching in a vertical direction in order to expose the i layer 21a. Consequently, the cylindrical column-shaped light reception portion 20A and the reinforcement portion 20B on the periphery thereof are divided with the concave portion 20C therebetween. In this concave portion 20C, an insulating material 40, for example, polyimide, is embedded on the periphery of the light reception portion 20A.

A p-type metal electrode 30A is formed on the surface on the side opposite to the semiconductor substrate 10 side of at least the light reception portion 20A, and an n-type metal electrode 30B is formed on the surface on the side opposite to the semiconductor substrate 10 side of the reinforcement portion 20B on which the p-type metal electrode 30A is not formed.

In the semiconductor substrate 10 of the photodiode 200, in a manner similar to that in the aforementioned surface emission laser 100, an opening portion 5 from the other surface 10b side of the semiconductor substrate 10 to the end portion on the semiconductor substrate 10 side of the light reception portion 20A is formed into the shape of a quadrangular pyramid in which the base is the other surface 10b side of the semiconductor substrate 10. On this opening portion 5, a convex lens 6, which is made of a transparent resin and which has a large curvature radius, is formed toward the other surface 10b side of the semiconductor substrate 10.

Solder bumps 80 are formed on the upper surface of the p-type metal electrode 30A and the n-type metal electrode 30B of the photodiode 200 having the aforementioned configuration, and mounting is performed on the drive substrate 110 including a plurality of receiving circuits for photodiode by flip chip bonding.

In accordance with the photodiode 200 having the aforementioned configuration, by applying a reverse bias voltage between the p-type metal electrode 30A and the n-type metal electrode 30B in order to make the i layer 21a a depletion layer, the laser light that is made to enter from the light reception portion 20A is absorbed and is converted to a photocurrent.

In accordance with the photodiode 200 of the present invention, since the opening portion 5 from the other surface 10b side of the semiconductor substrate 10 to the end portion on the semiconductor substrate 10 side of the light reception portion 20A is formed, and the opening portion 5 is provided with the lens 6, an equivalent light reception area of the light reception portion 20A can be increased. Consequently, since the element capacity of the photodiode 200 can be reduced, it becomes possible to realize the high-speed operation of the photodiode 200 while the optical connection efficiency is maintained.

In a manner similar to that in the surface emission laser 100, since the lens 6 is formed through the use of the side surface of the opening portion 5 formed in the semiconductor substrate 10, the lens 6 can be formed at the position apart from the light reception portion 20A and, therefore, it becomes possible to form the lens 6 having a large curvature radius with ease.

Figure 9:
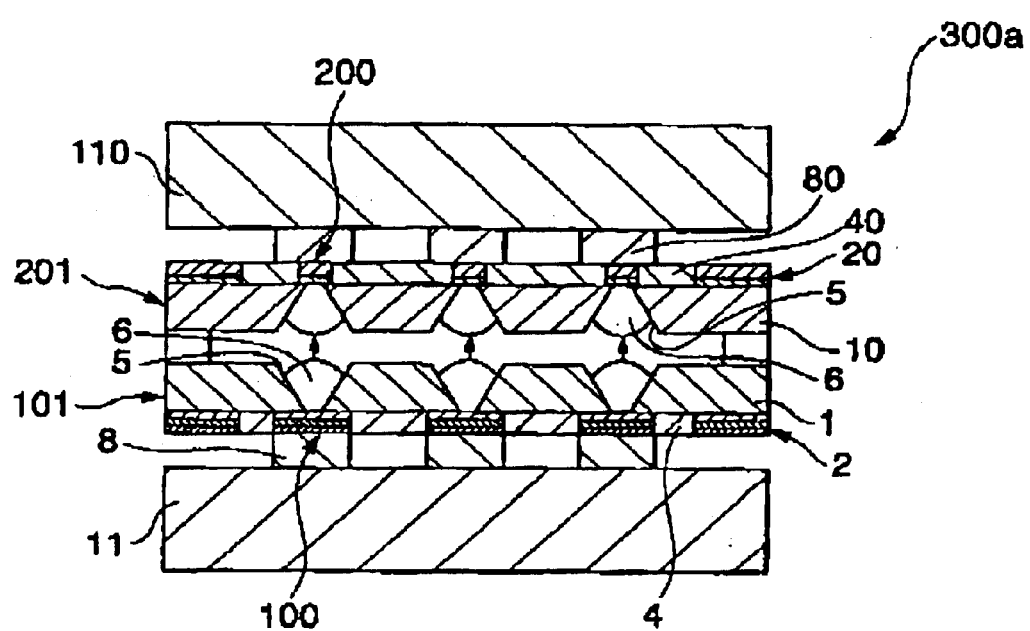
FIG. 9 is a sectional view of an optical transceiver module of an embodiment according to the present invention.

Next, an optical transceiver module 300a of an embodiment according to the present invention will be described with reference to FIG. 9. FIG. 9 is a sectional view of an optical transceiver module showing an embodiment according to the present invention.

This optical transceiver module 300a is formed of a surface emission laser array 101 in which the surface emission lasers 100 are arrayed, and a photodiode array 201 in which the photodiodes 200 are arrayed Herein, the lens 6 formed in the light emission portion 2A of the surface emission laser 100 and the lens 6 formed in the light reception portion 20A of the photodiode 200 are laminated and placed in order to optically face each other.

In the optical transceiver module 300a, the laser light generated at the light emission portion 2A by the voltage applied from the drive substrate 11 including a transmitting circuit for VCSEL is emitted from the lens 6 formed on the other surface (the upper surface in FIG. 9) of the semiconductor substrate 1. This laser light enters into the light reception portion 20A from the lens 6 of the photodiode 200 placed at the facing position, and the laser light is converted to a photocurrent by being applied with a voltage from the drive substrate 110 including a receiving circuit for photodiode.

Herein, in the optical transceiver module 300a according to the present invention, since lenses 6 are formed in both the light emission portion 2A of the surface emission laser 100 and the light reception portion 20A of the photodiode 200, it becomes possible to make the optical connection efficiency excellent without the use of an optical waveguide, for example, optical fiber. Consequently, an optical transceiver module 300a can be provided, in which labor hours for optical axis adjustment, etc., are reduced.

Since the surface emission laser 100, in which the light emission portion 2A is made to be narrow and small, is used as the light emission element, the apparatus can be operated with a low-current drive, and heat generation during arraying can be suppressed.

Since the photodiode 200 having reduced element capacity is used as the light reception element, it becomes possible to realize high-speed operation.

Since the surface emission laser 100 and the photodiode 200 are arrayed while clearance is created therebetween, mutual interference between elements that are adjacent to each other can be suppressed.

Figure 10:
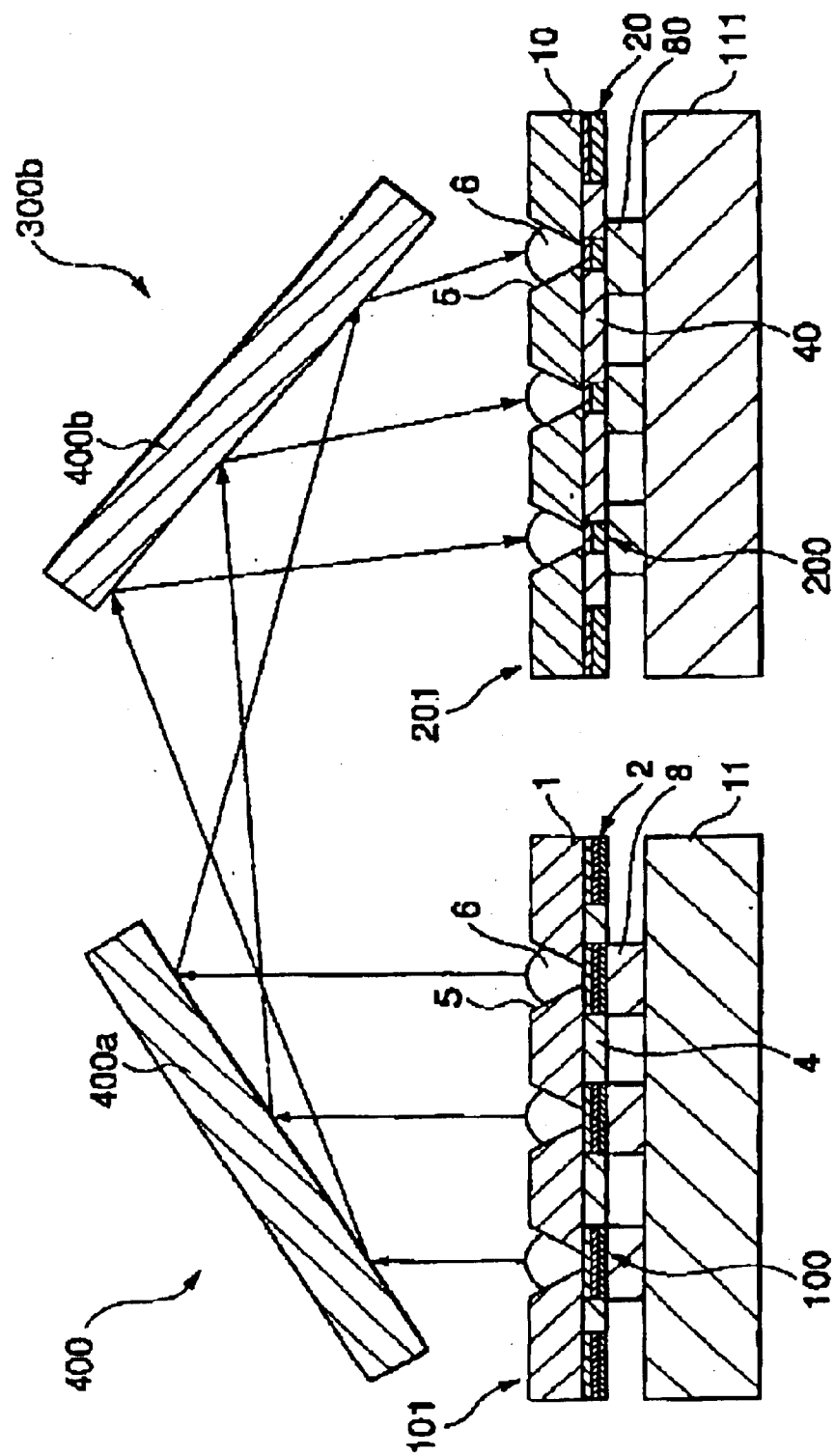
FIG. 10 is a sectional view of an optical transceiver module of another embodiment according to the present invention.

An optical transceiver module 300b of another embodiment according to the present invention will be described with reference to FIG. 10. FIG. 10 is a sectional view of an optical transceiver module of another embodiment according to the present invention.

This optical transceiver module 300b is formed of a surface emission laser array 101 in which the aforementioned surface emission lasers 10 are arrayed, a photodiode array 201 in which the aforementioned photodiodes 200 are arrayed, and a pair of error devices 400. Herein, the surface emission laser array 101 and the photodiode array 201 are placed side by side on the same surface. Both the lens 6 formed in the surface emission laser 100 and the lens 6 formed in the photodiode 200 face up. A first mirror device 400a of the pair of mirror devices 400 is formed above the light emission portion 2A of the surface emission laser 100, and a second mirror device 400b is formed above the light reception portion 20A of the photodiode 200.

Herein, the laser light emitted from the light emission portion 2A of the surface emission laser 100 impinges on the mirror device 400a and is reflected so as to impinge on the second mirror device 400b. The laser light impinged on the second mirror device 400b is reflected so as to enter the light reception portion 20A of the photodiode 200.

In this optical transceiver module 300b, since lenses 6 are formed on both the light emission portion 2A of the surface emission laser 100 and the light reception portion 20A of the photodiode 200, the radiation angle of the laser light is reduced and, therefore, it becomes possible to perform optical connection through the use of reflection of the mirror device 400. At this time, when this mirror device 400 is made to be movable, and the case where the laser light impinges, and the case where the laser light does not impinge are adjusted, it is expected to use the mirror device 400 to switch of the optical transceiver module 300b.

Figure 11:
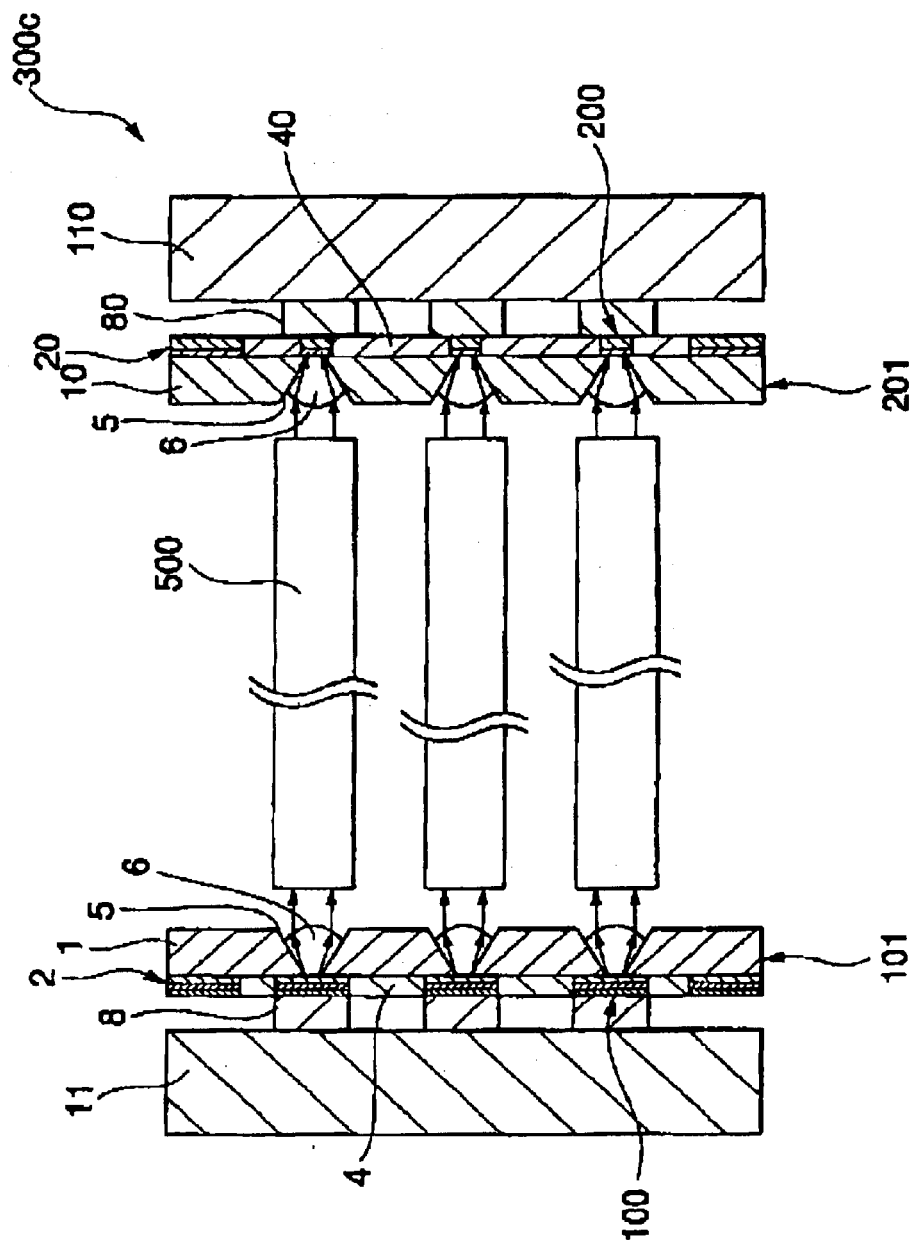
FIG. 11 is a sectional view of an optical transceiver module of another embodiment according to the present invention.

An optical transceiver module 300c of another embodiment according to the present invention will be described with reference to FIG. 11.

This optical transceiver module 300c is formed of a surface emission laser array 101 in which the aforementioned surface emission lasers 100 are arrayed, a photodiode array 201 in which the aforementioned photodiodes 200 are arrayed, and optical fibers 500. Herein, the optical fiber 500 is connected between the light emission portion 2A of the surface emission laser 100 and the light reception portion 20A of the photodiode 200.

Herein, since the light emission portion 2A and the light reception portion 20A are connected with the optical fiber 500, it is possible to stabilize the optical connection efficiency of the laser light. However, in order to use the optical waveguide, for example, the optical fiber 500, each of the optical axes of the surface emission laser 100, the optical fiber 500, and the photodiode 200 must be adjusted.

Herein, in the present embodiment, the PIN photodiode has been used as the light reception element. However, the invention is not limited to this, and any light reception element, for example, a phototransistor, may be used. Any optical transceiver module 300 according to the present invention can be used for the present embodiment as long as the lens 6 is formed in at least one of the light emission element and the light reception element.

In the present embodiment, respective semiconductor substrates 1 and 10 of the surface emission laser 100 and the photodiode 200 are not limited to that described above, and it is possible to use other substrates.

As described above, according to the surface emission laser of the present invention, since the opening portion from the other surface (that is, on the side where the semiconductor laminate has not been formed) of the substrate to the end portion on the substrate side of the light emission portion has been formed, it is possible to pass through the laser light of 850 nm even when the gallium arsenide substrate is used.

Since the lens is provided on the opening portion, it becomes possible to provide the surface emission laser in which the optical connection efficiency is enhanced and low-current drive is made possible.

Since the lens can be formed at a position spaced apart from the light emission portion through the use of the side surface of the opening portion, it becomes possible to form the lens having a large curvature radius with ease.

Since the lens is made of a transparent resin, it becomes possible to form the lens best-suited to the predetermined conditions even on a small opening portion with ease and reliability.

In particular, by the surface emission laser according to the fourth and fifth aspects, the surface emission laser can be arrayed at a high density, and the surface emission laser array can be mixturized.

According to the light reception element of the present invention, since the opening portion from the other surface (that is, on the side where the light reception portion has not been formed) of the substrate to the end portion on the substrate side of the light reception portion is formed, and the opening portion is provided with the lens formed through the use of the inclined surface thereof, it becomes possible to provide a light reception element in which the optical connection efficiency is enhanced and high-speed modulation is provided.

By the optical transceiver module according to the present invention, it becomes possible to provide an optical transceiver module which provides excellent optical connection efficiency, and low-current drive and high-speed modulation can be provided.

What is claimed is:

1. A surface emission laser, comprising:
a substrate having one surface and another surface;
a semiconductor laminate formed on the one surface of the substrate, the semiconductor laminate including a light emission portion to emit laser light; and
a pair of electrodes to apply a voltage in order to pass a current in a lamination direction of the light emission portion;
the substrate including a tapered opening portion which becomes narrow from the other surface of the substrate to an end portion on the substrate side of the light emission portion, and the opening portion including a lens in contact with a side of the tapered opening portion.

2. The surface emission laser according to claim 1, the lens being made of a transparent resin.

3. The surface emission laser according to claim 1, an emission opening to emit the laser light being opened in the electrode formed on the surface on the side opposite to the substrate side of the light emission portion, and the laser light emitted from the emission opening entering the light reception element to perform monitoring.

4. An optical transceiver module, comprising:

the surface emission laser according to claim 1;

a light reception element having a substrate having one surface and another surface, and a light reception portion which is formed on the one surface of the substrate and into which laser light enters, the substrate including an opening portion from the other surface of the substrate to an end portion on the substrate side of the light reception portion, and the opening portion including a lens formed through the use of the side surface thereof.

5. A light reception element, comprising:

a substrate having one surface and another surface;

a semiconductor laminate disposed below the substrate; and a light reception portion formed on the one surface of the substrate and into which laser light enters;

the substrate including a tapered opening portion which becomes narrow from the other surface of the substrate to an end portion on the substrate side of the light reception portion, and the opening portion including a lens in contact with a side of the tapered opening portion.

6. The light reception element according to claim 5, the lens being made of a transparent resin.

7. An optical transceiver module, comprising:

a surface emission laser that includes a substrate having one surface and another surface;

a semiconductor laminate formed on the one surface of the substrate, the semiconductor laminate including a light emission portion to emit laser light; and a pair of electrodes to apply a voltage in order to pass a current in a lamination direction of the light emission portion;

the substrate including a tapered opening portion which becomes narrow from the other surface of the substrate to an end portion on the substrate side of the light emission portion, and the opening portion including a lens in contact with a side of the tapered opening portion.

8. An optical transceiver module, comprising:

a light reception element that includes;

a substrate having one surface and another surface; and a light reception portion formed on the one surface of the substrate and into which laser light enters;

the substrate including a tapered opening portion which becomes narrow from the other surface of the substrate to an end portion on the substrate side of the light reception portion, and the opening portion including a lens in contact with a side of the tapered opening portion.

* * * * *